(12) United States Patent
Zhe et al.

(10) Patent No.: US 7,692,288 B2
(45) Date of Patent: Apr. 6, 2010

(54) MEMS PACKAGING METHOD FOR ENHANCED EMI IMMUNITY USING FLEXIBLE SUBSTRATES

(75) Inventors: Wang Zhe, Singapore (SG); Miao Yubo, Singapore (SG)

(73) Assignee: Silicon Matrix Pte Ltd., Singapore (SG)

( * ) Notice: Subject to any disclaimer, the term of this patent is extended or adjusted under 35 U.S.C. 154(b) by 832 days.

(21) Appl. No.: 11/333,579

(22) Filed: Jan. 17, 2006

(65) Prior Publication Data

US 2007/0013052 A1   Jan. 18, 2007

Related U.S. Application Data

(63) Continuation-in-part of application No. 11/182,254, filed on Jul. 15, 2005, now Pat. No. 7,202,552.

(51) Int. Cl.
*H01L 23/12* (2006.01)
(52) U.S. Cl. .................. 257/704; 257/680; 257/710; 257/730; 257/414; 257/E23.004; 257/E23.193; 174/250; 174/525
(58) Field of Classification Search .................. 257/414, 257/680, 700, 704, 710, 730, 659, E23.193, 257/E23.004, E23.006; 174/250, 585
See application file for complete search history.

(56) References Cited

U.S. PATENT DOCUMENTS

| | | | |
|---|---|---|---|
| 6,324,907 B1 | 12/2001 | Halteren et al. | 73/431 |
| 6,521,530 B2 * | 2/2003 | Peters et al. | 438/667 |
| 6,781,231 B2 | 8/2004 | Minervini | 257/704 |
| 6,912,078 B2 | 6/2005 | Kudrle et al. | 359/224 |
| 7,166,910 B2 * | 1/2007 | Minervini | 257/704 |
| 2002/0102004 A1 | 8/2002 | Minervini | 381/175 |
| 2004/0046245 A1 * | 3/2004 | Minervini | 257/704 |
| 2004/0231872 A1 * | 11/2004 | Arnold et al. | 174/35 R |
| 2005/0018864 A1 | 1/2005 | Minervini | 381/175 |
| 2005/0135727 A1 | 6/2005 | Piede et al. | 385/14 |

OTHER PUBLICATIONS

PCT Patent App. PCT/SG2005/000034, Filed Feb. 8, 2005, "A Packaging Method for MEMS Devices, and MEMS Packages Produced Using the Method", assigned to the same assignee.
Co-pending U.S. Appl. No. 11/182,254, filed Jul. 15, 2005, "A MEMS Package Using Flexible Substrates, and Method Thereof", assigned to the same assignee.

* cited by examiner

*Primary Examiner*—Evan Pert
*Assistant Examiner*—Leslie Pilar Cruz
(74) *Attorney, Agent, or Firm*—Saile Ackerman LLC; Stephen B. Ackerman; Rosemary L. S. Pike (57) ABSTRACT

A MEMS package and methods for its embodiment are described. The MEMS package has at least one MEMS device mounted on a flexible and foldable substrate. A metal cap structure surrounds the at least one MEMS device wherein an edge surface of the metal cap structure is attached to the flexible substrate and wherein a portion of the flexible substrate is folded under itself thereby forming the MEMS package. A meshed metal environmental hole underlying the at least one MEMS device provides enhanced EMI immunity.

9 Claims, 12 Drawing Sheets

MEMS PACKAGING METHOD FOR ENHANCED EMI IMMUNITY USING FLEXIBLE SUBSTRATES

This is a Continuation-in-Part of U.S. patent application Ser. No. 11/182,254, filed on Jul. 15, 2005, now U.S. Pat. No. 7,202,552, which is herein incorporated by reference in its entirety.

BACKGROUND OF THE INVENTION (1) Field of the Invention

The invention relates to processes for packaging MEMS devices, and MEMS packages produced using the method, and more particularly, to a method of packaging MEMS devices for enhanced EMI immunity using a flexible, foldable substrate.

(2) Description of the Related Art

Micro-electro-mechanical systems (MEMS) devices are known which convert physical phenomena, such as pressure, acceleration, sound, or light, into electrical signals. Each type of MEMS device interacts with the world in a different way, and demands custom or at least semi-custom packaging solutions. So-called system-in-package techniques attempt to form an entire microsystem—which could include a microprocessor, communications components, actuators and sensors—within a single package. However, packaging of a MEMS device is totally different from packaging an integrated circuit. MEMS devices are categorically different from ICs despite sharing some fundamental processing technologies. Packaging is the biggest challenge for commercializing most MEMS devices. The term "MEMS package" is used in this document to imply a package including at least one MEMS device.

A MEMS device might function perfectly well in the controlled environment in which it was created. However, the device can be a real viable product only after it has been packaged with proven performance in a package. For example, the packaging stress can distort the sensitivity and the performance of the MEMS devices. MEMS devices include delicate movable structures which are easily damaged through fabrication and assembly processes. As such, the assembly yield of a MEMS package is often a challenging target to meet.

The packaging requirements of MEMS devices are complex because the devices need to interact with the physical phenomenon and yet the devices need to be protected from the environment. As such, exotic package structures with specialized assembly techniques and unique packaging materials are employed for MEMS devices.

U.S. Pat. No. 6,324,907 to Halteren et. al. discloses a flexible substrate assembly in which a transducer element and other signal processing devices can be integrated and encapsulated with a metal cap. The flexible substrate has the elongation to provide easy connectivity between the transducer assembly and compact electronic equipment like mobile phone and hearing aid products.

U.S. Pat. No. 6,781,231 to Minervini teaches a method of packaging a MEMS microphone into a house formed by a substrate having at least one conductive layer and a conductive cap. The conductive layer and cap are electrically connected to shield the MEMS acoustic transducer from external EMI.

U.S. Patent Application No. 2002/0102004 A1 to Minervini discloses a MEMS microphone package in which a MEMS transducer element, an IC die and other capacitor components are located on a first multi-layer FR4 printed circuit board (PCB). A second multi-layer FR4 PCB is used as a cover. The two FR4 boards are spaced apart by a third FR4 board, which is cut to include a window which is placed around the components on the first PCB. Thus, the three PCBs cooperate to house and shield the transducer element, the IC die and other capacitor components. Compared with plastic/lead frame packages, such a package enables a larger batch operation, requires minimal hard tooling and has better match of thermal expansion with end user's PCB.

PCT patent application PCT/SG2005/000034 filed on 8 Feb. 2005 provides a method and package in which at least one MEMS device is mounted on a first flex substrate, and one or more electronic components are mounted on a second substrate. The two substrates are then joined mechanically in parallel with a spacer element between them and connected electrically by electrical connecting elements. The substrates sandwich the spacer element, the electrical connecting elements, the MEMS device and the one or more electronic components between them. The advantage of this method is that the process of mounting the MEMS device can be dealt with and performed separately from the process for mounting other IC and electronics components, thus making the assembly easier and higher yield. However, interconnecting the two substrates is a challenging task.

U.S. patent application Ser. No. 11/182254, filed on Jul. 15, 2005 teaches the methods of using flexible substrates and folding processes to make MEMS packages.

Figure 1:
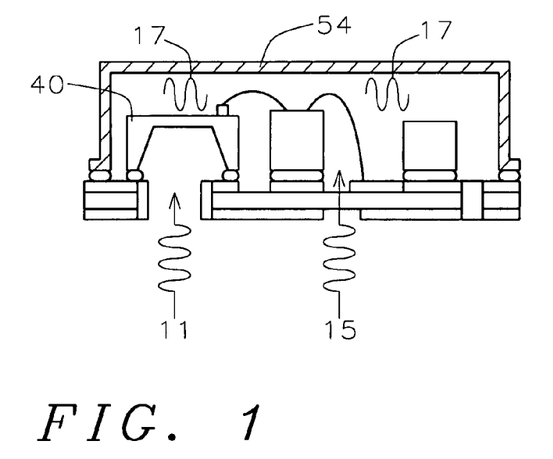
FIG. 1 schematically illustrates in cross-sectional representation a MEMS package showing EMI leakage points.

However, ubiquitous electromagnetic interference (EMI) leakage is a major noise source to most electronic devices, especially for acoustic MEMS devices because of required openings for sound inlet. EMI signals can easily find their ways to go through the environmental hole or through overlapping gaps between metal layers on the substrate, for example. FIG. 1 illustrates a MEMS package including MEMS device 40 and other devices located on a substrate 10 including a grounded metal layer and covered by a grounded metal cap 54. EMI leakage can occur through environmental hole 11 and through overlapping gaps 15. EMI noise is represented by 17 in the figure.

U.S. Patent Application 2005/0018864 to Minervini shows a cavity under the MEMS device in a multi-layer1 PCB. A polymeric layer is adopted as an environmental barrier within the acoustic aperture for preventing moisture, dirt and/or dust from entering the packaging house. U.S. Patent Application 2005/0135727 (Piede et al) shows opto-electronic components on an SOI layer. EMI shielding is provided by a metallized outer layer plated on the SOI over EMI-sensitive electronics and coupled to an external ground plane.

SUMMARY OF THE INVENTION

A principal object of the present invention is to provide an effective and very manufacturable method of producing a MEMS package incorporating a MEMS device and one or more other electronic circuits.

Another object of the invention is to provide a MEMS package.

Yet another object of the invention is to provide a method of producing a MEMS package using a flexible and foldable substrate.

A further object of the invention is to provide a MEMS package including a flexible and foldable substrate.

A still further object is to provide a method of producing a MEMS package with enhanced EMI immunity using a flexible and foldable substrate.

A still further object is to provide a MEMS package with enhanced EMI immunity using a flexible and foldable substrate.

Yet another object is to provide a method of producing a MEMS package with enhanced EMI immunity using a flexible and foldable substrate and a metal meshed environmental hole.

Yet another object is to provide a MEMS package with enhanced EMI immunity using a flexible and foldable substrate and a metal meshed environmental hole.

A further object is to provide a method of producing a MEMS package with enhanced EMI immunity using a flexible and foldable substrate, a metal meshed environmental hole, and a metal plate.

A still further object is to provide a MEMS package with enhanced EMI immunity using a flexible and foldable substrate, a metal meshed environmental hole, and a metal plate.

A yet further object is to provide a method of producing a MEMS package with enhanced EMI immunity using a flexible and foldable substrate and a metal plate having a punched hole under the MEMS device.

Yet another object is to provide a MEMS package with enhanced EMI immunity using a flexible and foldable substrate and a metal plate having a punched hole under the MEMS device.

In accordance with the objects of this invention a MEMS package is achieved. The MEMS package has at least one MEMS device located on a flexible substrate. A metal cap structure surrounds the at least one MEMS device wherein an edge surface of the metal cap structure is attached to the flexible substrate and wherein a portion of the flexible substrate is folded under itself thereby forming the MEMS package. A meshed metal environmental hole underlying the at least one MEMS device provides enhanced EMI immunity.

Optionally, the flexible substrate may be attached to a rigid conductive plate in the area underlying the devices. Optionally, a punched hole may be formed within the rigid conductive plate underlying the MEMS device. In this case, the hole under the MEMS device is not open to the environment, but a plurality of acoustic openings are made in the metal structure overlying the at least one MEMS device.

Also in accordance with the objects of this invention a method of producing a MEMS package is proposed. At least one MEMS device is mounted onto a flexible substrate. A meshed metal environmental hole is formed underlying the at least one MEMS device. An edge surface of a metal cap structure is attached to the flexible substrate surrounding the at least one MEMS device. The flexible substrate is folded under itself and attached to itself thereby forming the MEMS package of the invention.

Optionally, the flexible substrate may be attached to a rigid conductive plate in the area underlying the devices. Optionally, a punched hole may be formed within the rigid conductive plate underlying the meshed metal environmental hole. In this case, the hole under the MEMS device is not open to the environment, but a plurality of acoustic openings are made in the metal structure overlying the at least one MEMS device.

Also in accordance with the objects of the invention, a method for fabricating a metal meshed hole in a MEMS package is achieved. A substrate is provided comprising a flexible material having a metal layer thereover. The metal layer is patterned to form a meshed metal hole. The flexible material underlying the patterned metal layer is removed to complete fabrication of the meshed metal hole.

Optionally, a bottom metal layer underlying the flexible material is patterned to form a hole underlying the meshed metal hole. Optionally, a rigid conductive plate underlying the flexible material is patterned to form a hole underlying the meshed metal hole.

BRIEF DESCRIPTION OF THE DRAWINGS

In the accompanying drawings forming a material part of this description, there is shown.

DESCRIPTION OF THE PREFERRED EMBODIMENTS

The present invention proposes a method for packaging a MEMS device as well as one or more electronic components (typically, an application specific IC (ASIC) and one or more passive components). The MEMS device and IC device are first assembled on a flexible substrate which has an elongated portion. The MEMS device is wirebonded directly to the IC device to minimize parasitic effects. The present invention provides MEMS packages and methods of fabricating the MEMS packages that provide enhanced EMI immunity.

A first preferred embodiment of the invention is illustrated in FIGS. 2 through 6. A second preferred embodiment of the invention is illustrated in FIGS. 10-14. A third preferred embodiment of the invention is illustrated in FIGS. 15-20. It will be understood by those skilled in the art that the invention should not be limited to the MEMS microphone device illustrated in the drawing figures, but that the invention can be applied to many other applications for packaging other types of MEMS device such as pressure sensors, accelerometers, gyroscopes, and so on, or other MEMS devices which may be proposed in the future.

Figure 2:
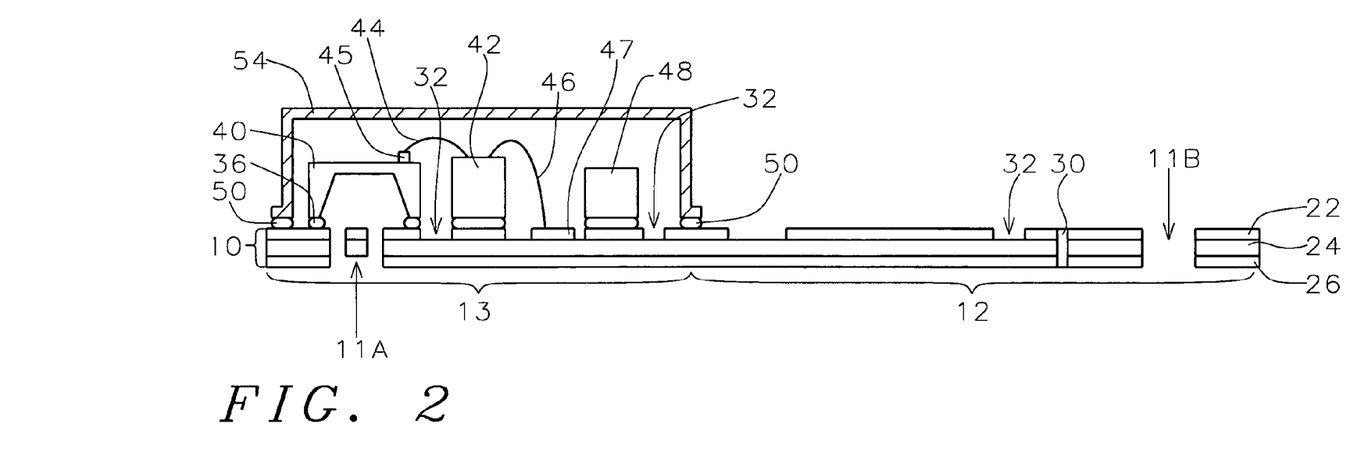
FIGS. 2 and 3 schematically illustrate in cross-sectional representation the first preferred embodiment of the present invention.

The first embodiment of the invention will now be described with reference to FIGS. 2 through 6. Referring now more particularly to FIG. 2, there is illustrated a double metal layer (2ML) flexible substrate of the present invention. The flexible substrate 10 is formed of the core film layer 24 and copper metal layers 22 and 26 on both sides. The core film layer may be polyimide, polyethylene polyimide (PEI), poly tetra fluoro ethylene (PTFE), or liquid crystal polymer (LCP).). The polyimide layer 24 is between about 12.5 and 100 µm in thickness. Such a core film of the flexible substrate 10 has a much lower modulus (typically 5 GPa) than a FR-4 printed circuit board (PCB) (typically 25 GPa), and so offers stress relaxation and minimizes the interaction of packaging stress or environmentally induced stress with a MEMS device mounted on it. The flexible substrate 10 includes a portion 13 on which are mounted the devices and an elongated portion 12.

Metal layers 22 and 26 are laminated to the top and bottom of the flexible core film layer 24 using adhesive or adhesive-less laminating techniques. Metal layers 22 and 26 are preferably copper, having a metal surface finish for wirebonding. The copper layer is typically 25 µm in thickness, but can be more or less, depending on the application. The surface finish metal can be Ni/Au, where the nickel layer is about 3 µm thick and the overlying gold layer has a minimum thickness of about 0.35 µm.

In a key feature of the present invention, the flexible substrate 10 includes an opening 11, known as an environmental hole. This may be a circular or square-shaped opening that allows external fluid, acoustic energy or pressure to interact with the MEMS device to be mounted thereover. The opening 11B is made through all three layers of the flexible substrate in the elongated portion 12. Opening 11B may be a mechanically punched hole. The opening 11A is made through the bottom metal layer 26 and the core layer 24 and is made in the form of a meshed opening in top metal layer 22. More details about the formation of the meshed metal opening will follow.

Figure 4A:
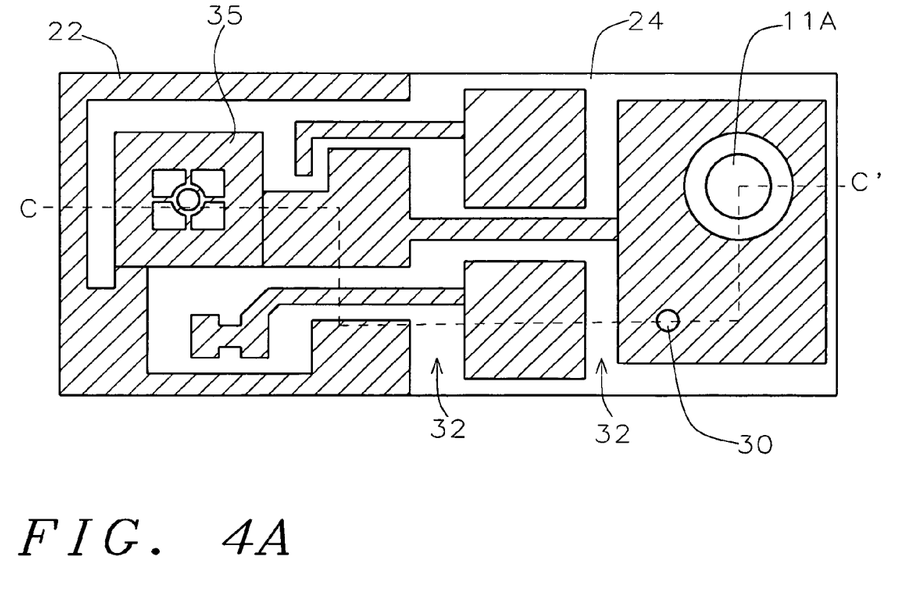
FIGS. 4A and 4B schematically illustrate in top view the top side and bottom side, respectively, of the flexible substrate in the first preferred embodiment of the invention. Also indicated in FIGS. 4A and 4B are the cross sectional cutting lines C-C' of FIG. 2.
Figure 4B:
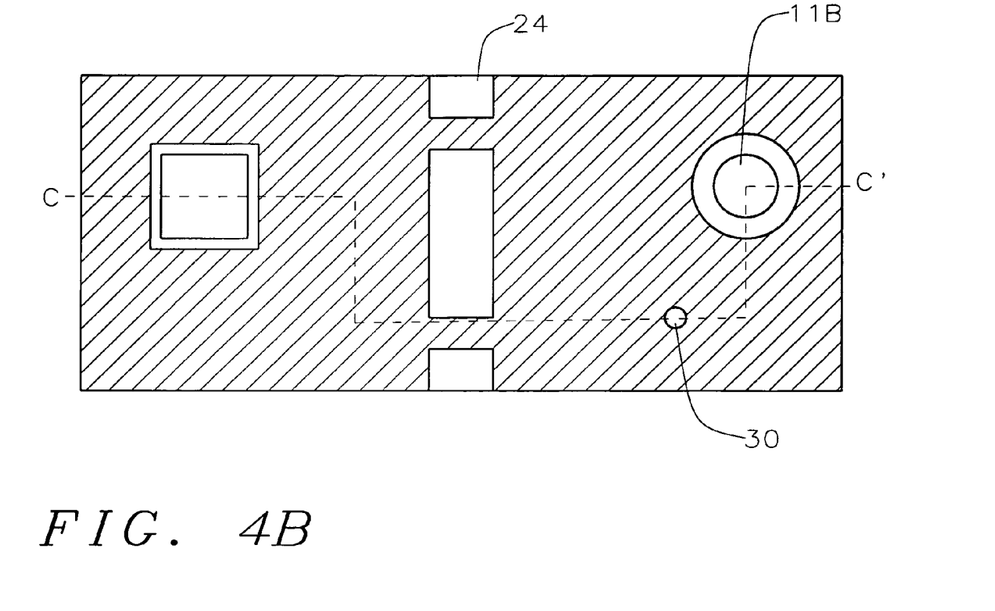

FIG. 4A shows a top view of the top side of the flexible substrate 10 in FIG. 2. The top metal layer 22 has been formed and patterned on the core material layer 24, as shown. Top metal layer 22 comprises copper with plated Ni/Au thereover. FIG. 4B shows a transparent view of the bottom side of the flexible substrate 10, showing bottom metal layer 26, also comprising copper with plated Ni/Au. The cross sectional FIG. 2 follows line C-C' shown in FIGS. 4A and 4B.

Figure 5:
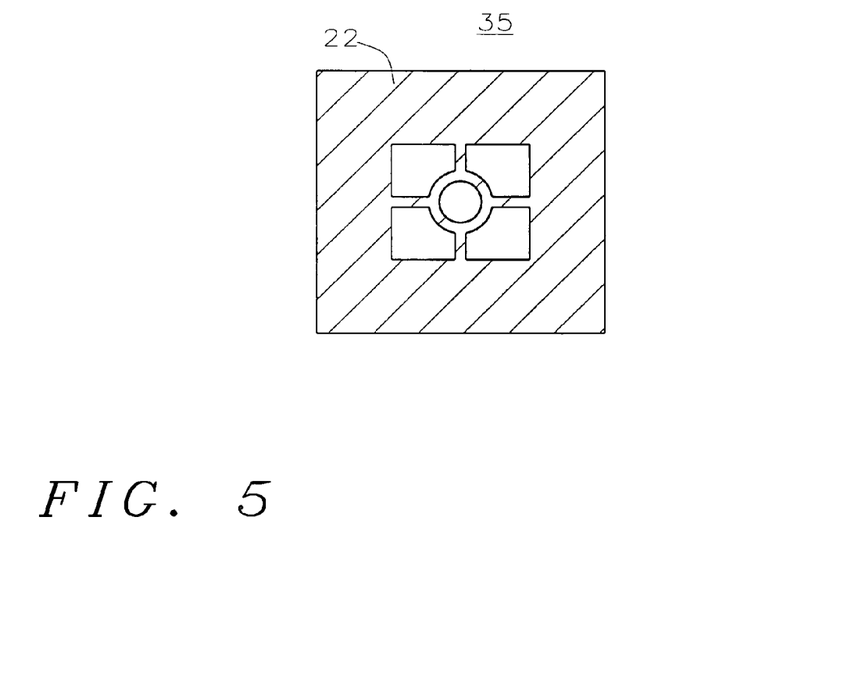
FIG. 5 schematically illustrates an enlarged cross-sectional representation of the metal meshed hole of the invention shown in FIG. 4A.
Figure 7:
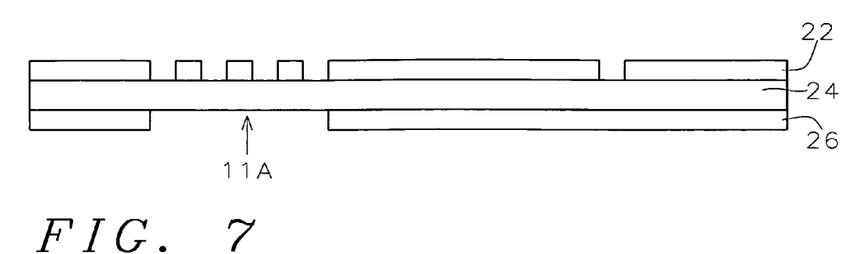
FIGS. 7 and 8 schematically illustrate in cross-sectional representation steps in a method of forming the metal meshed hole of the present invention.
Figure 8:
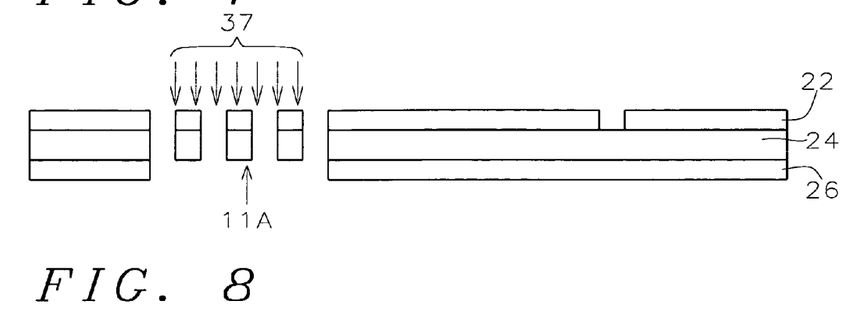

A metal meshed hole is made in the top metal layer 22 in the opening 11A. FIG. 5 shows an enlarged illustration of the metal meshed hole 35 shown in FIG. 4A. Referring now to FIGS. 7 and 8, a method for forming the metal meshed hole 35 will be described. The top metal layer 26 is patterned, for example, by lithographic masking and wet etching, as shown in FIG. 7. The bottom metal layer 26 is also patterned by lithographic masking and wet etching, for example. The bottom metal layer 26 is completely removed within the environmental opening 11A. Next, as shown in FIG. 8, laser exposure 37, for example, is performed in the opening 11A to remove the core material 24 in the openings of the patterned metal layer 22.

Figure 9A:
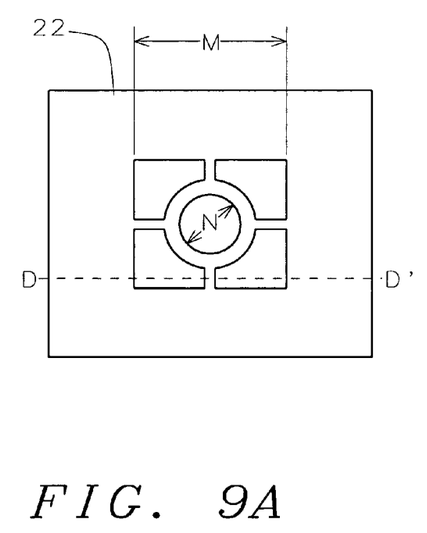
FIGS. 9A and 9B schematically illustrate an enlarged top view representation of two examples of a design of the metal meshed hole of the present invention.
Figure 9B:
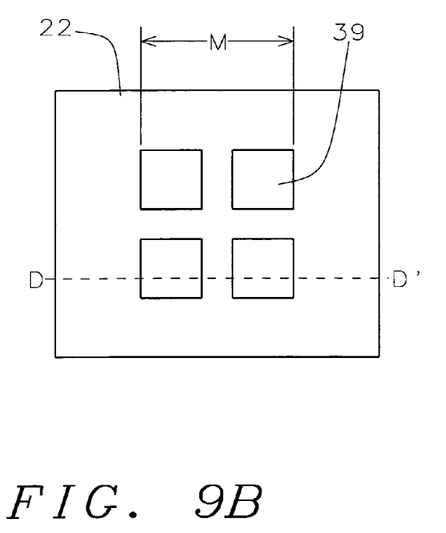

FIGS. 9A and 9B illustrate enlarged top views of examples of the design of the metal meshed hole. Cross-sectional view FIG. 8 is taken along cutting line D-D' of FIGS. 9A and 9B. It is anticipated that other meshed designs could also be used in the process of the present invention. The metal meshed hole provides grounded metal wires within the environmental hole, thus affording enhanced EMI immunity.

For example, in the design shown in FIG. 9A, the environmental hole may have a width M of about 0.50 microns. The central circular metal portion may have a diameter of about 0.30 millimeters and an opening diameter N of about 0.15 millimeters. In the design shown in FIG. 9B, for example, the environmental hole may have a width M of about 0.50 millimeters. Each of the openings 39 may be about 0.20×0.20 millimeters in size.

Referring again to FIG. 2, on the elongated portion 12 of the flexible substrate is formed via 30, plated and plugged as a ground via, as shown in FIGS. 4A and 4B. Openings 32 in the metal layer 22 are also shown in FIGS. 2 and 4A.

The passive components, the MEMS devices and the IC devices are mounted onto the flexible substrate 10 on the portion 13. One MEMS device 40, one integrated circuit device 42, and one passive device 48 are illustrated. It will be understood that the MEMS package of the invention comprises at least one MEMS device, but that more than one MEMS device may be included. One or more electronic components, such as IC 42, typically, an application specific IC (ASIC) and one or more passive components such as a capacitor, resistor, inductor, or other passive device may be included in the package.

The MEMS device 40 is attached to the flexible substrate 10 with an adhesive 36. A low modulus adhesive would be preferred for stress relaxation such as a silicone based adhesive. Any IC device 42 is attached to the flexible substrate 10 using an adhesive in a die-attach process. Any passive device 48 is attached to the flexible substrate by a surface mounting technique (SMT). The IC device 42 is then wire-bonded by wires 44 and 46 to a bond pad 45 on the MEMS device 40 and to pad 47, respectively. For example, pad 47 may be for connection of the IC to VDD or OUT.

A metal cap 54 is attached to the flexible substrate by a conductive adhesive or solder 50. The metal cap may comprise copper, a copper alloy, an aluminum alloy, an iron alloy with solderable metal finish, a plastic with a metal finish formed by either electroless plating or painting, or a conductive composite formed by either injection molding or transfer molding. The metal cap 54 may be attached to the flexible substrate with a conductive adhesive, a solder (eutectic PbSn or any lead-free SnAg, SnAgCu), or a combination of a conductive adhesive or solder with a non-conductive adhesive. The soldering attachment may be done by using a solder reflow or hot bar method. The metal cap encapsulates all the devices on the flexible substrate. The metal cap 54 and the metal layer 26 on the flexible substrate 10 are electrically connected to form a Faraday cage for EMI/RF shielding.

Figure 3:
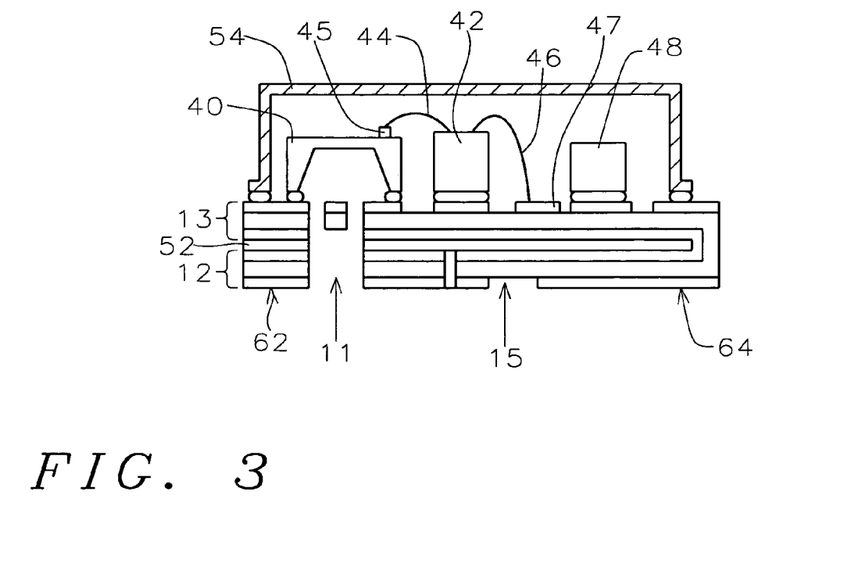
Figure 6A:
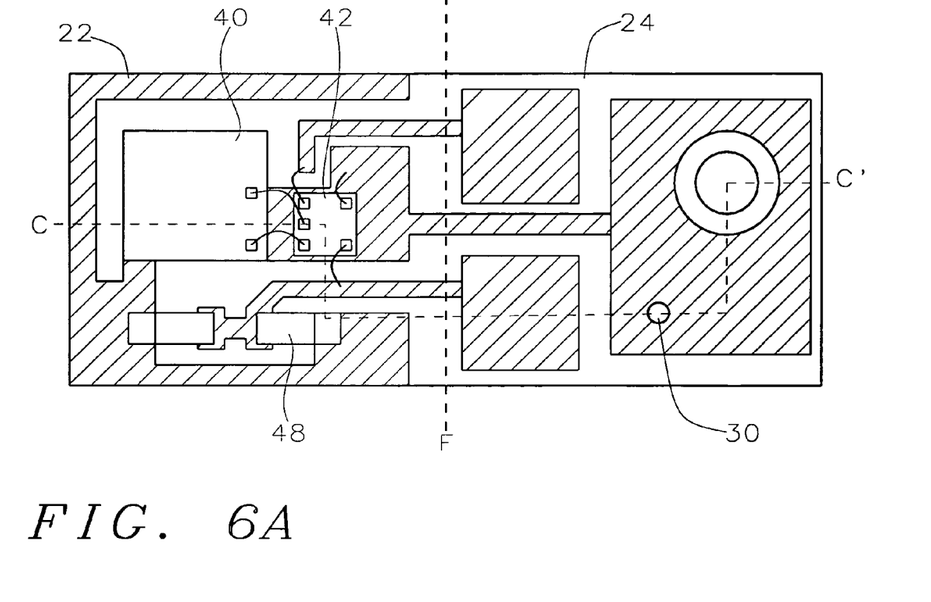
FIGS. 6A and 6B schematically illustrate in top view the top side and bottom side, respectively, of the flexible substrate in the first preferred embodiment of the invention. Also indicated in FIGS. 6A and 6B are the cross sectional cutting lines C-C' of FIG. 3.
Figure 6B:
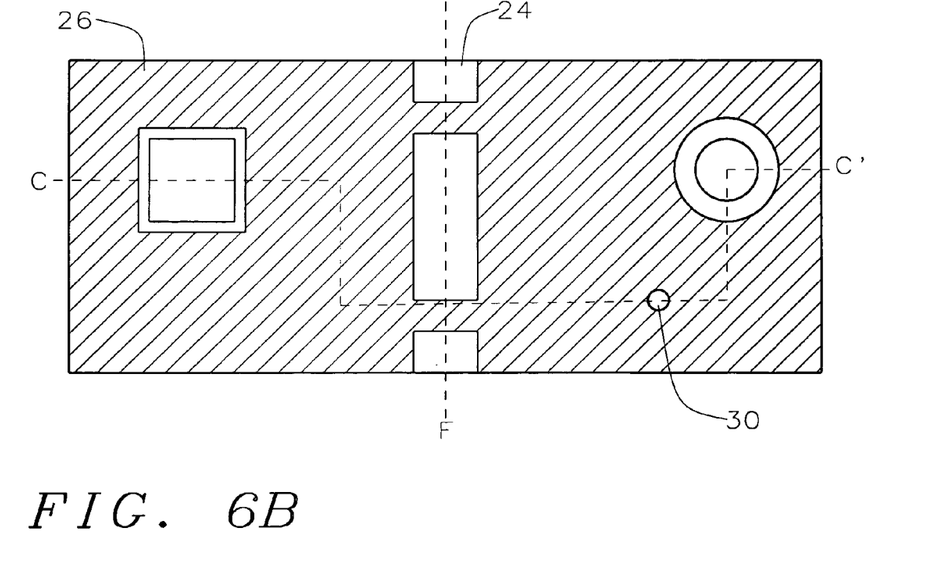

Referring now to FIG. 3, the elongated portion 12 of the flexible substrate 10 is folded under the portion 13 of the flexible substrate underlying the devices and attached to portion 13 by an adhesive 52. FIG. 6A illustrates the top metal layer 22 of FIG. 3, showing the folding line F. FIG. 6B illustrates the bottom metal layer 26 of FIG. 3, showing the folding line F. Ground pad 62 and OUT/VDD pad 64 are shown in FIG. 3. Openings 11A and 11B line up to form the environmental hole 11.

The packaged MEMS device can now be assembled onto an application PCB by a surface mounting process, for example. The meshed metal environmental hole 11 of the present invention improves EMI immunity. Also EMI immunity is enhanced in the area of overlapping gaps 15. Since the flexible substrate is folded under itself, multiple layers of metal 26 which are grounded come between the openings 32 in the metal layer 22. In FIG. 1, the overlapping gaps were separated only by the flexible material 24.

The meshed metal hole of the present invention can be used in the process of co-pending U.S. patent application Ser. No. 11/182,254, filed on Jul. 15, 2005 where the flexible substrate is folded over the metal cap or metal ring structure.

Figure 10:
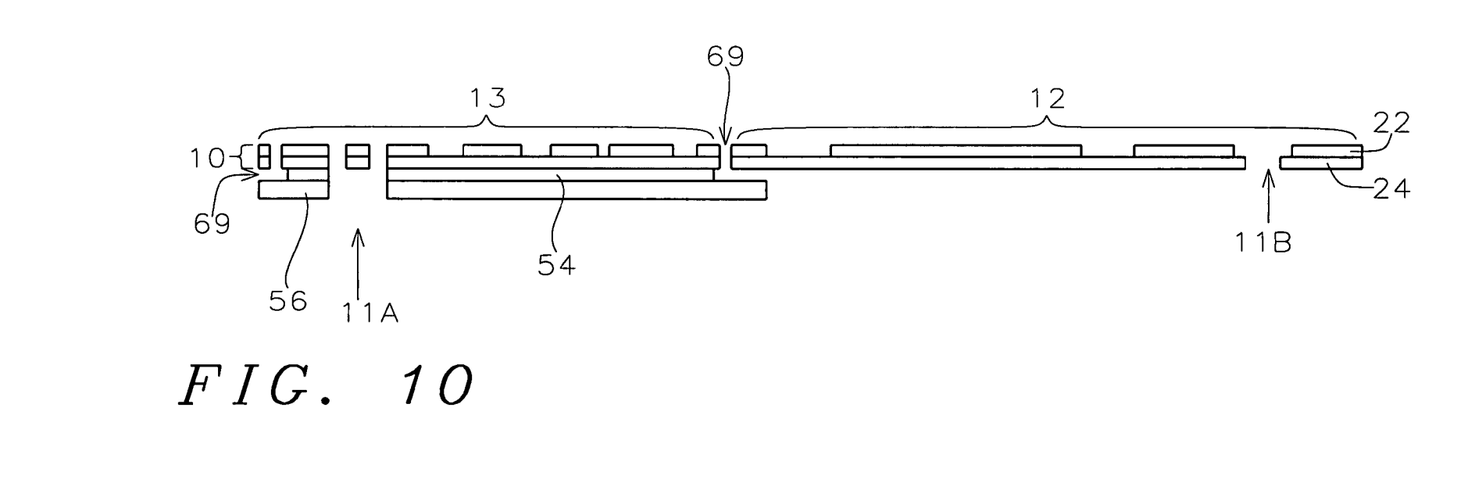
FIGS. 10, 12, and 13 schematically illustrate in cross-sectional representation the second preferred embodiment of the present invention.

The second embodiment of the present invention will be described with reference to FIGS. 10-14. In this embodiment, a rigid conductive plate is combined with a flexible substrate of the invention. In this embodiment, a single metal layer (1ML) flexible substrate 10 may be used. Referring now to FIG. 10, a 1ML flexible substrate 10 is illustrated, comprising metal layer 22 and core film 24. The core film layer may be polyimide, polyethylene polyimide (PEI), poly tetra fluoro ethylene (PTFE), or liquid crystal polymer (LCP).). The polyimide layer 24 is between about 12.5 and 100 µm in thickness. The flexible substrate 10 includes a portion 13 on which are mounted the devices and an elongated portion 12.

Metal layer 22 is laminated to the top of the flexible core film layer 24 using adhesive or adhesive-less laminating techniques. Metal layer 22 is preferably copper, having a metal surface finish for wirebonding. The copper layer is typically 25 µm in thickness, but can be more or less, depending on the application. The surface finish metal can be Ni/Au, where the nickel layer is about 3 µm thick and the overlying gold layer has a minimum thickness of about 0.35 µm.

A metal plate 56 is joined to portion 13 of the flexible substrate 10 by a first adhesive layer 54. The metal plate may comprise copper, aluminum, iron or any other metal alloy having a thickness of between about 0.1 to 0.5 mm. Alternatively, for example, a one metal layer PCB 56, such as a FR4 board, may be attached under the flexible substrate. "FR" means Flame Retardant and Type "4" indicates woven glass reinforced epoxy resin. FIG. 10 illustrates the metal plate 56 laminated to the portion 13 of the flexible substrate 10 underlying the components.

In a key feature of the present invention, the flexible substrate 10 includes an opening 11, known as an environmental hole, as well as openings 69. The opening 11 may be a circular or square-shaped opening that allows external fluid, acoustic energy or pressure to interact with the MEMS device to be mounted thereover. The openings 11B and 69 are made through the flexible substrate. These openings may be punched holes. The opening 11A is made through the metal plate or PCB 56 and the core layer 24 and is made in the form of a meshed opening in top metal layer 22, as described above in connection with the first embodiment of the invention.

Figure 11A:
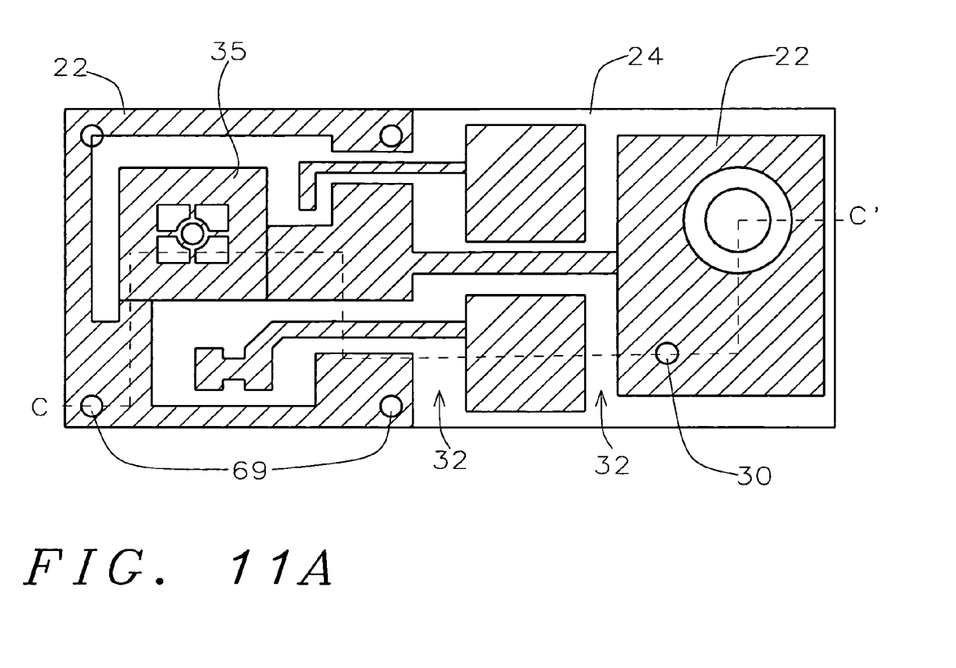
FIGS. 11A and 11B schematically illustrate in top view the top side and bottom side, respectively, of the flexible substrate in the second preferred embodiment of the invention. Also indicated in FIGS. 11A and 11B are the cross sectional cutting lines C-C' of FIG. 10.
Figure 11B:
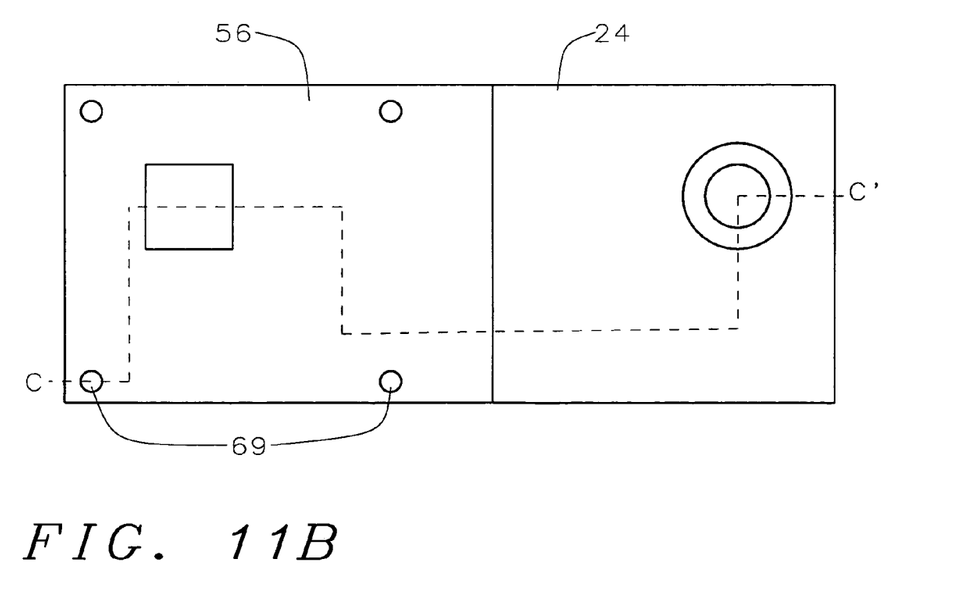

FIG. 11A shows a top view of the top side of the flexible substrate 10 in FIG. 10. The top metal layer 22 has been formed and patterned on the polyimide material 24, as shown. Top metal layer 22 comprises copper with plated Ni/Au thereover. FIG. 11B shows a transparent view of the bottom side of the flexible substrate 10, showing metal plate or PCB 56 and core layer 24. The cross sectional FIG. 10 follows line C-C' shown in FIGS. 11A and 11B.

Figure 12:
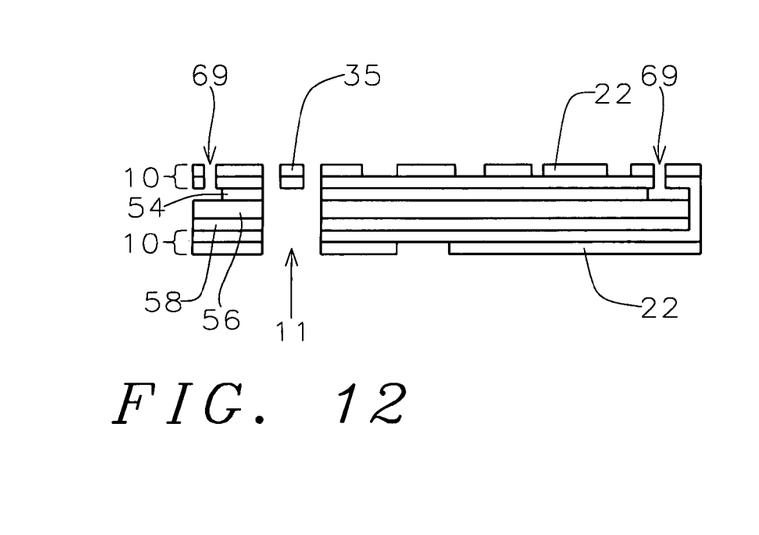

Referring now to FIG. 12, the elongated portion 12 of the flexible substrate 10 is folded under the portion 13 of the flexible substrate underlying the devices and attached to the metal plate or PCB 56 of portion 13 by a second adhesive 58. Openings 11A and 11B line up to form the environmental hole 11 under meshed metal hole 35. Folding may be done before or after device mounting, but after attaching metal plate 56.

Figure 13:
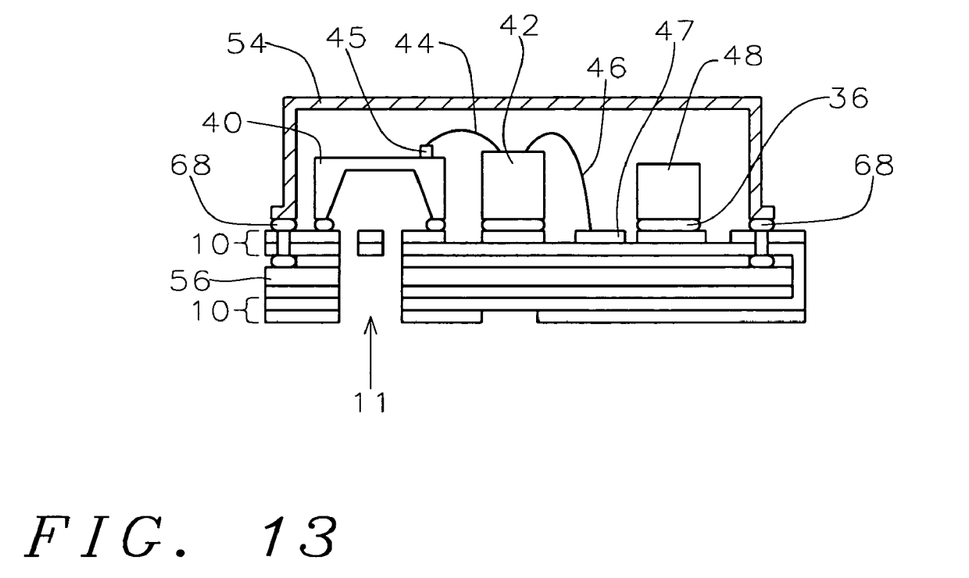

As illustrated in FIG. 13, the passive components, the MEMS devices and the IC devices are mounted onto the flexible substrate 10 on the portion 13. One MEMS device 40, one integrated circuit device 42, and one passive device 48 are illustrated. It will be understood that the MEMS package of the invention comprises at least one MEMS device, but that more than one MEMS device may be included. One or more electronic components, such as IC 42, typically, an application specific IC (ASIC) and one or more passive components such as a capacitor, resistor, inductor, or other passive device may be included in the package.

The MEMS device 40 is attached to the flexible substrate 10. A low modulus adhesive would be preferred for stress relaxation such as a silicone based adhesive. Any IC device 42 is attached to the flexible substrate 10 using an adhesive in a die-attach process. Any passive device 48 is attached to the flexible substrate by a surface mounting technique (SMT). The IC device 42 is then wire-bonded by wires 44 and 46 to a bond pad 45 on the MEMS device 40 and to pad 47, respectively. For example, pad 47 may be for connection of the IC to VDD or OUT.

A metal cap 54 is attached to the flexible substrate by a third conductive adhesive or solder 68 through punched holes 69. This connects the metal cap to the metal plate or PCB 56. The metal cap may comprise copper, a copper alloy, an aluminum alloy, an iron alloy with solderable metal finish, a plastic with a metal finish formed by either electroless plating or painting, or a conductive composite formed by either injection molding or transfer molding. The metal cap 54 may be attached to the metal plate or PCB 56 through the punched holes 69 with a conductive adhesive, a solder (eutectic PbSn or any lead-free SnAg, SnAgCu), or a combination of a conductive adhesive or solder with a non-conductive adhesive. The soldering attachment may be done by using a solder reflow or hot bar method. The metal cap encapsulates all the devices on the flexible substrate. The metal cap 54, the metal plate 56, and the metal layer 26 on the flexible substrate 10 are electrically connected to form a Faraday cage for EMI/RF shielding.

Figure 14:
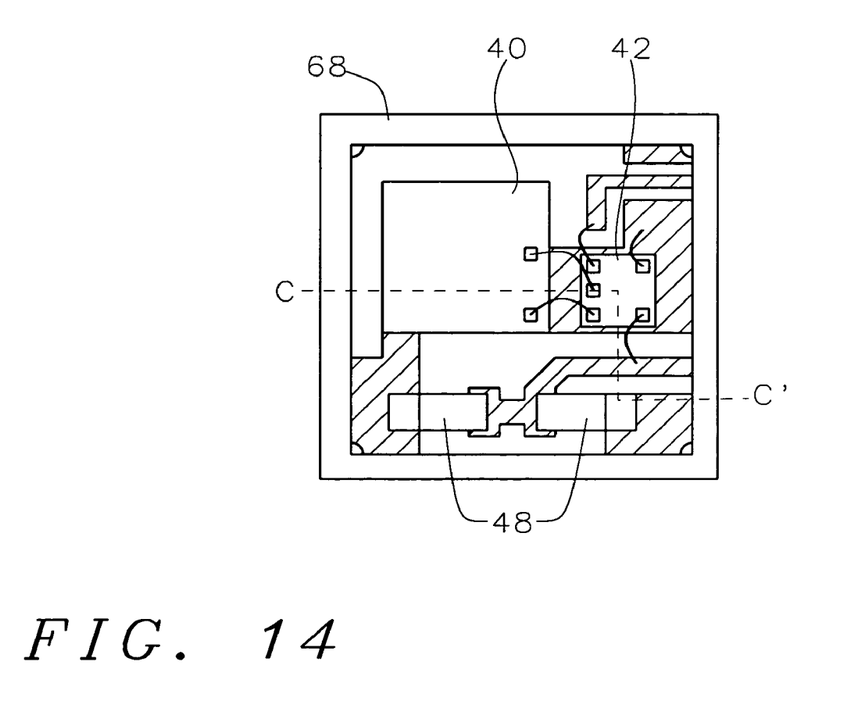
FIG. 14 schematically illustrates in top view the top side of the flexible substrate in the second preferred embodiment of the invention shown in cross-section in FIG. 13. Also indicated in FIG. 14 is the cross sectional cutting line C-C' of FIG. 13.

FIG. 14 shows a top view of FIG. 13 without the metal cap 54. The third adhesive 68 is shown. This adhesive 68 joins the metal cap around the perimeter of the MEMS device area to cover the devices.

The packaged MEMS device can now be assembled onto an application PCB by a surface mounting process, for example. The meshed metal environmental hole 11 of the present invention improves EMI immunity.

Figure 15:
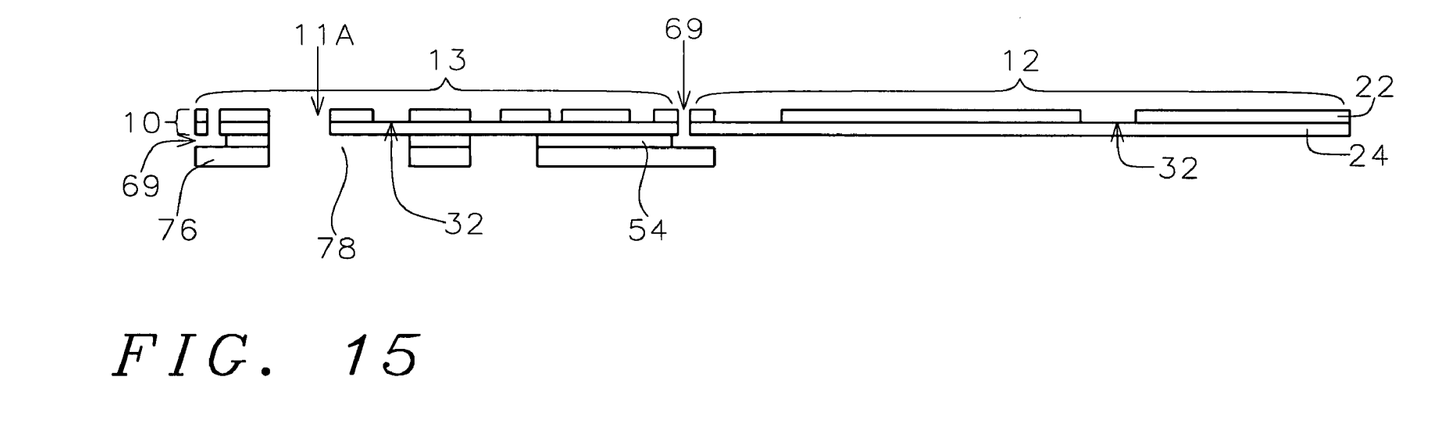
FIGS. 15, 17, and 19 schematically illustrate in cross-sectional representation the third preferred embodiment of the present invention.

The third embodiment of the invention will be described with reference to FIGS. 15-20. In this embodiment, a rigid conductive plate with a punched hole is combined with a flexible substrate of the invention. In this embodiment, a single metal layer flexible substrate 10 may be used. Referring now to FIG. 15, a 1ML flexible substrate 10 is illustrated, comprising metal layer 22 and core film 24. This 1ML flexible substrate is the same as that described in the second embodiment. The core film layer may be polyimide, polyethylene polyimide (PEI), poly tetra fluoro ethylene (PTFE), or liquid crystal polymer (LCP).). The polyimide layer 24 is between about 12.5 and 100 µm in thickness. The flexible substrate 10 includes a portion 13 on which are mounted the devices and an elongated portion 12. In this embodiment, the meshed metal hole is not necessary.

Figure 18A:
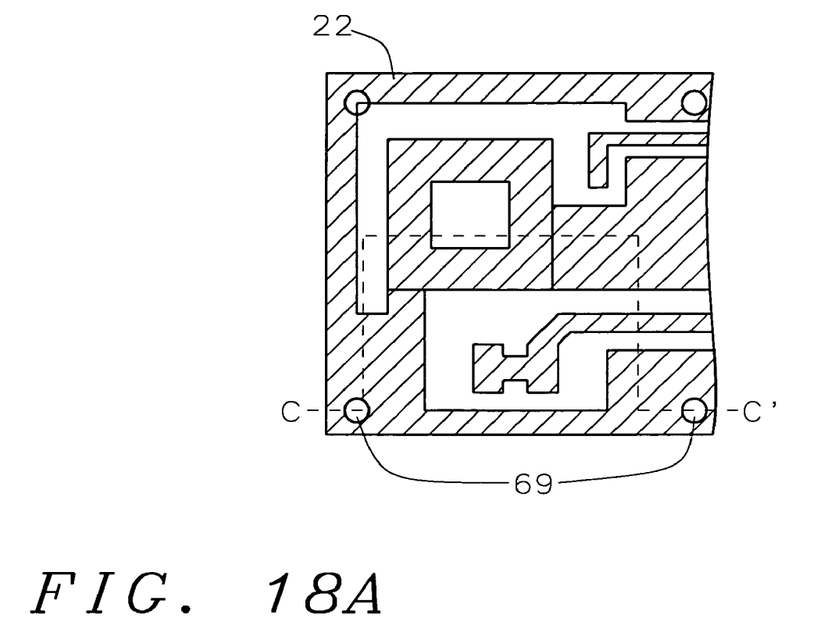
FIGS. 18A and 18B schematically illustrate in top view the top side and bottom side, respectively, of the flexible substrate in the third preferred embodiment of the invention shown in cross-section in FIG. 17.
Figure 18B:
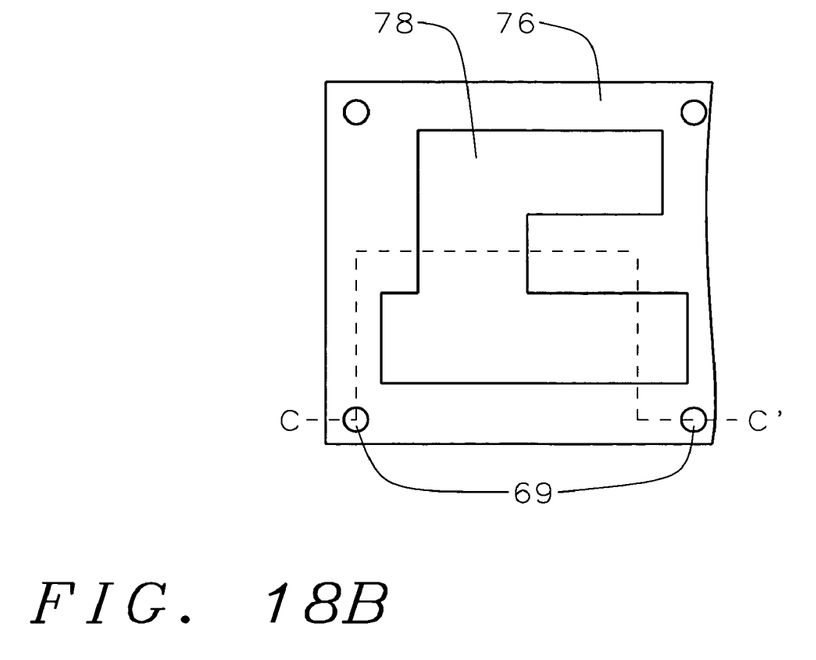

A metal plate 76 having a punched opening 78, as illustrated in FIG. 18B, is joined to portion 13 of the flexible substrate 10 by a first adhesive layer 54. The metal plate may comprise copper, aluminum, iron or any other metal alloy, having a thickness of 0.1 to 0.5 mm. Alternatively, for example, a single metal layer FR4 PCB 76 may be attached under the flexible substrate. FIG. 15 illustrates the metal plate 76 laminated to the portion 13 of the flexible substrate 10 underlying the components.

In a key feature of the present invention, the flexible substrate 10 includes an opening 11A. The opening 11A is a passage hole, required to provide the path to the back chamber formed by the punched opening in the metal plate 76 for the MEMS device, as such a microphone, for example, to function.

Figure 16A:
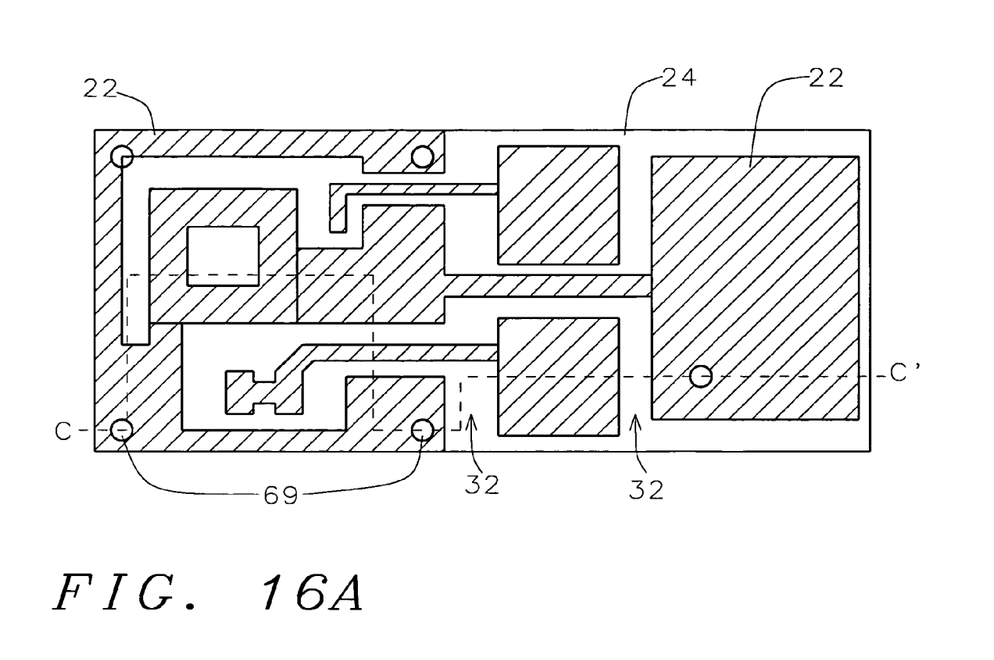
FIGS. 16A and 16B schematically illustrate in top view the top side and bottom side, respectively, of the flexible substrate in the third preferred embodiment of the invention shown in cross-section in FIG. 15.
Figure 16B:
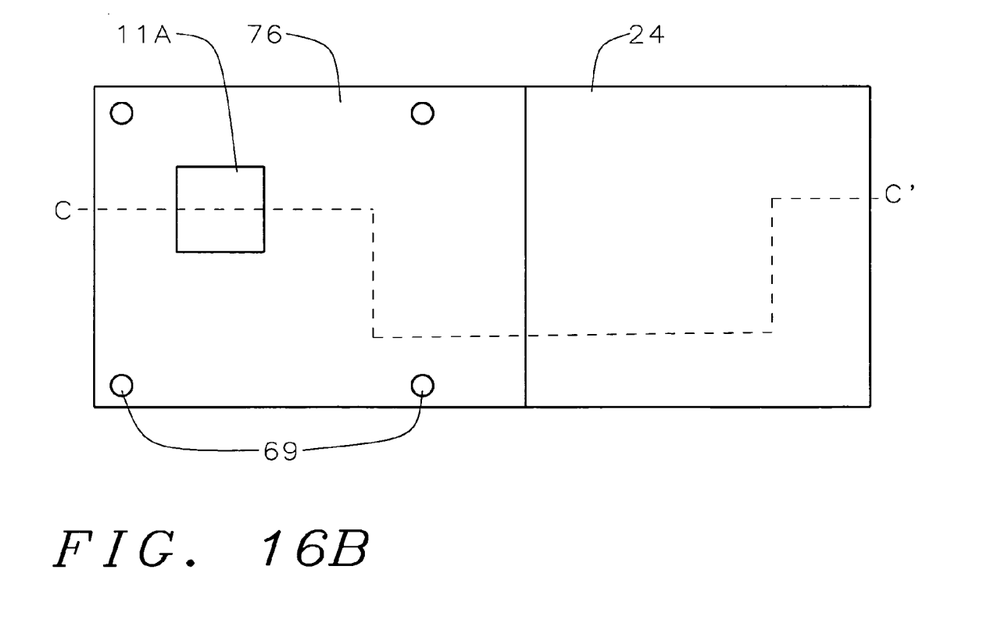

FIG. 16A shows a top view of the top side of the flexible substrate 10 in FIG. 15. The top metal layer 22 has been formed and patterned on the polyimide material 24, as shown. Top metal layer 22 comprises copper with plated Ni/Au thereover. FIG. 16B shows a top view of the bottom side of the flexible substrate 10, showing metal plate or PCB 76 and core layer 24. The cross sectional FIG. 15 follows line C-C' shown in FIGS. 16A and 16B. Openings 32 in the metal layer 22 are also shown in FIGS. 15 and 16A.

Figure 17:
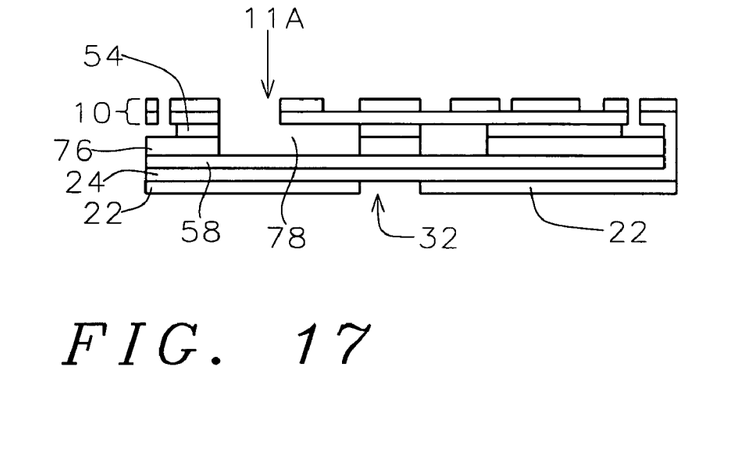

Referring now to FIG. 17, the elongated portion 12 of the flexible substrate 10 is folded under the portion 13 of the flexible substrate underlying the devices and attached to the metal plate or PCB 76 of portion 13 by a second adhesive 58. In this embodiment, the opening 11A opens to the punched hole 78, but not to the outside of the device package. Folding can be performed before or after mounting the devices, but after attachment of the metal plate 76.

FIG. 18A illustrates a top view of the top layer of the substrate 10 after folding. FIG. 18B illustrates a top view of the rigid substrate 76 with a punched opening 78.

Figure 19:
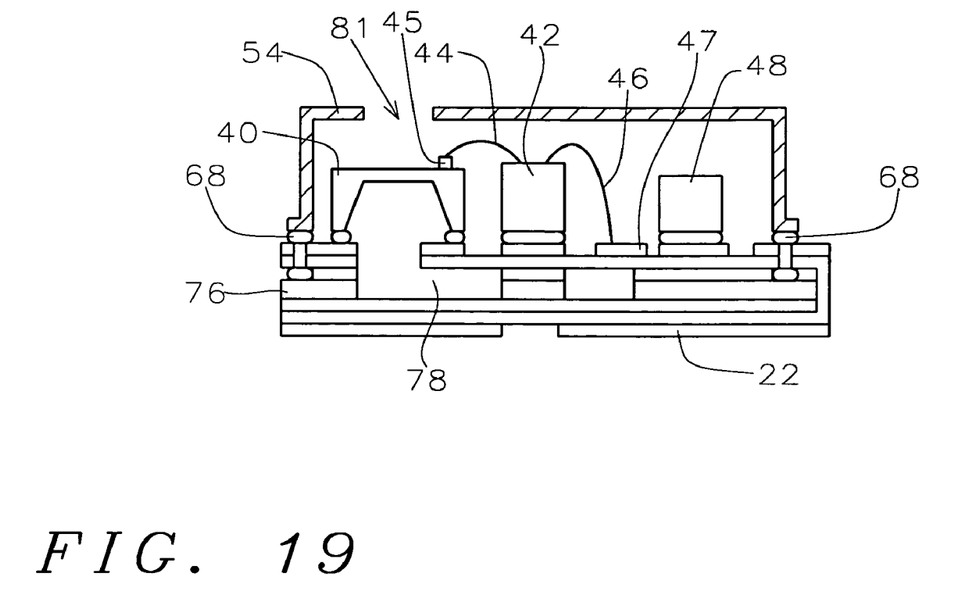

As illustrated in FIG. 19, the passive components, the MEMS devices and the IC devices are mounted onto the flexible substrate 10 on the portion 13. One MEMS device 40, one integrated circuit device 42, and one passive device 48 are illustrated. It will be understood that the MEMS package of the invention comprises at least one MEMS device, but that more than one MEMS device may be included. One or more electronic components, such as IC 42, typically, an application specific IC (ASIC) and one or more passive components such as a capacitor, resistor, inductor, or other passive device may be included in the package.

The MEMS device 40 is attached to the flexible substrate 10. A low modulus adhesive 36 would be preferred for stress relaxation such as a silicone based adhesive. Any IC device 42 is attached to the flexible substrate 10 using an adhesive in a die-attach process. Any passive device 48 is attached to the flexible substrate by a surface mounting technique (SMT). The IC device 42 is then wire-bonded by wires 44 and 46 to a bond pad 45 on the MEMS device 40 and to pad 47, respectively. For example, pad 47 may be for connection of the IC to VDD or OUT.

A metal cap 54 is attached to the flexible substrate by a third conductive adhesive or solder 68 through punched holes 69. This connects the metal cap to the metal plate or PCB 76. The metal cap may comprise copper, a copper alloy, an aluminum alloy, an iron alloy with solderable metal finish, a plastic with a metal finish formed by either electroless plating or painting, or a conductive composite formed by either injection molding or transfer molding. The metal cap may have one or a plurality of environmental holes or acoustic holes 81 in it above the MEMS device 40. The acoustic hole 81 may be a circular or square-shaped opening that allows external fluid, acoustic energy or pressure to interact with the MEMS device.

The metal cap 54 may be attached to the metal plate or PCB 76 through the punched holes 69 with a conductive adhesive, a solder (eutectic PbSn or any lead-free SnAg, SnAgCu), or a combination of a conductive adhesive or solder with a non-conductive adhesive. The soldering attachment may be done by using a solder reflow or hot bar method. The metal cap encapsulates all the devices on the flexible substrate. The metal cap 54, the metal plate or PCB 76, and the metal layer 22 on the flexible substrate 1 0 are electrically connected to form a Faraday cage for EMI/RF shielding.

Figure 20:
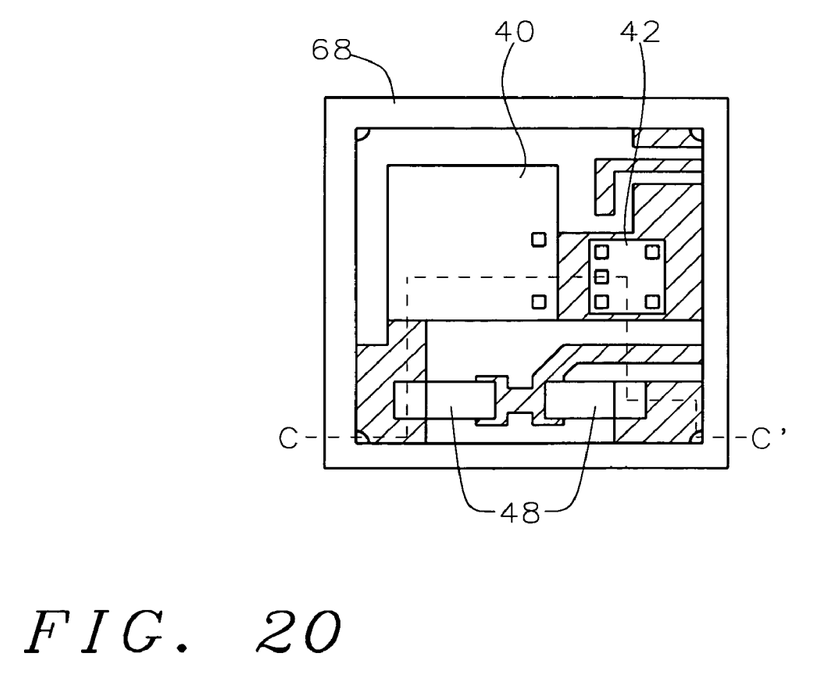
FIG. 20 schematically illustrates in top view the top side of the flexible substrate in the third preferred embodiment of the invention shown in cross-section in FIG. 19.

FIG. 20 shows a top view of FIG. 19. The third adhesive 68 is shown. This adhesive 68 joins the metal cap around the perimeter of the MEMS device area to cover the devices.

The packaged MEMS device can now be assembled onto an application PCB by surface mounting process, for example. The additional metal layers under the MEMS device provide enhanced EMI immunity.

The present invention provides MEMS packages using flexible substrates and methods of manufacturing these packages.

While the invention has been particularly shown and described with reference to the preferred embodiments thereof, it will be understood by those skilled in the art that various changes in form and details may be made without departing from the spirit and scope of the invention.

What is claimed is:

1. A MEMS package comprising:
   at least one MEMS device;
   a flexible substrate having at least one metal layer on a top side of which said at least one MEMS device is mounted;
   a rigid conductive plate having a top side attached to a bottom side of said flexible substrate and underlying said at least one MEMS device wherein a portion of said flexible substrate is folded and attached to a bottom side of said rigid conductive plate;
   a passage hole in said flexible substrate underlying said at least one MEMS device;
   a plurality of via holes in said flexible substrate;
   a metal cap structure surrounding said at least one MEMS device wherein an edge surface of said metal cap structure is attached and electrically connected to said folded flexible substrate and to said rigid conductive plate through said via holes in said flexible substrate wherein said metal cap structure and said at least one metal layer in said flexible substrate together provide EMI shielding of said at least one MEMS device;
   at least one punched opening in said rigid conductive plate and underlying said passage hole in said flexible substrate wherein said at least one punched opening and said passage hole provide a back chamber for said at least one MEMS device; and
   an environmental hole in said metal cap structure.

2. The package according to claim 1 wherein said flexible substrate comprises a core film with a copper layer on a top side of said core film or copper layers on both sides of said core film wherein said core film comprises polyimide, polyethylene polyimide, poly tetra fluoro ethylene, or liquid crystal polymer.

3. The package according to claim 1 wherein said at least one metal layer in said flexible substrate comprises a copper metal layer with a surface finish of nickel and gold.

4. The package according to claim 1 wherein said metal cap structure encapsulates said at least one MEMS device and may comprise a copper, a copper alloy, an aluminum alloy, an iron alloy with solderable metal finish, a plastic with a metal finish formed by either electroless plating or painting, or a conductive composite material formed by either injection molding or transfer molding.

5. The package according to claim 1 wherein said environmental hole permits interaction between said MEMS device and the environment outside said package.

6. The package according to claim 1 wherein said rigid conductive plate comprises a metal plate or a FR-4 PCB.

7. The package according to claim 1 wherein said metal cap structure is attached and electrically connected to said at least one metal layer in said flexible substrate and a top portion of said rigid conductive plate through said via holes in said flexible substrate at said edge surface of said metal cap structure by a conductive adhesive, or soldering, or a combination of conductive adhesive or soldering and a non-conductive adhesive, or by a combination of a conductive adhesive or solder with a non-conductive adhesive.

8. The package according to claim 1 further comprising one or more electronic components located on said flexible substrate and within said metal cap structure.

9. The package according to claim 8 further comprising wire bonding connections among said one or more electronic components, said at least one MEMS device, and said flexible substrate.

* * * * *